United States Patent
Carstensen et al.

(10) Patent No.: US 8,829,938 B2
(45) Date of Patent: Sep. 9, 2014

(54) MEASURING METHOD AND DEVICE FOR CHARACTERIZING A SEMICONDUCTOR COMPONENT

(75) Inventors: Jürgen Carstensen, Kiel (DE); Andreas Schütt, Kiel (DE); Helmut Föll, Mönkeberg (DE); Wilhelm Warta, Freiburg (DE); Martin Kasemann, Denzlingen (DE)

(73) Assignees: Fraunhofer-Gesellschaft zur Föderung der angewandten Forschung e.V., Munich (DE); Christian-Albrechts-Universität zu Kiel, Kiel (DE); Albert-Ludwigs-Universität Frieburg, Freiburg (DE)

( * ) Notice: Subject to any disclaimer, the term of this patent is extended or adjusted under 35 U.S.C. 154(b) by 455 days.

(21) Appl. No.: 12/918,921

(22) PCT Filed: Feb. 23, 2009

(86) PCT No.: PCT/EP2009/001277
§ 371 (c)(1),
(2), (4) Date: Sep. 30, 2010

(87) PCT Pub. No.: WO2009/103566
PCT Pub. Date: Aug. 27, 2009

(65) Prior Publication Data
US 2011/0012636 A1    Jan. 20, 2011

(30) Foreign Application Priority Data
Feb. 22, 2008 (DE) .......... 10 2008 010 672

(51) Int. Cl.
G01R 31/265    (2006.01)
G01R 31/26     (2014.01)

(52) U.S. Cl.
CPC ........ G01R 31/2656 (2013.01); G01R 31/2605 (2013.01)
USPC ... 324/761.01; 324/96; 324/501; 324/754.23; 257/E21.523; 257/E21.527; 438/16

(58) Field of Classification Search
CPC .. G01R 31/265; G01R 31/308; G01R 31/309; G01R 31/311; G01R 31/302; G01R 31/2656
USPC ............ 324/761.01, 96, 501, 537, 754.21, 324/754.23; 257/E21.521, E21.525, 257/E21.527, E21.531; 438/16, 18, 17; 356/218
See application file for complete search history.

(56) References Cited

U.S. PATENT DOCUMENTS 5,512,966 A * 4/1996 Snook .................. 351/205
6,169,414 B1 * 1/2001 Yoshino et al. .......... 324/761.01

FOREIGN PATENT DOCUMENTS

| EP | 0887652 | 12/1998 |
| WO | WO 2007004118 A2 * | 1/2007 |
| WO | 2007041758 | 4/2007 |
| WO | 2007128060 | 11/2007 |
| WO | 2008014537 | 2/2008 |

* cited by examiner

Primary Examiner — Patrick Assouad
Assistant Examiner — Alexander J Nemtzow
(74) Attorney, Agent, or Firm — Volpe and Koenig, P.C.

(57) ABSTRACT

A measuring method and device for characterizing a semiconductor component (1) having a pn junction and a measuring surface, which has a contacting subarea, covered by a metallization. The method including: A. Planar application of electromagnetic excitation radiation onto the measuring area of the semiconductor component (1) for separating charge carrier pairs in the semiconductor component (1), and B. spatially resolved measurement of electromagnetic radiation originating from the semiconductor component (1) using a detection unit. In one step A, a predetermined excitation subarea of the measuring surface has a predetermined intensity of the excitation radiation and at least one sink subarea of the measuring surface has an intensity of the excitation radiation which is less than the intensity applied to the excitation subarea. The excitation and sink subareas are disposed on opposite sides of said contacting subarea and adjoin it and/or entirely or partially overlap it.

18 Claims, 3 Drawing Sheets

MEASURING METHOD AND DEVICE FOR CHARACTERIZING A SEMICONDUCTOR COMPONENT

BACKGROUND

The invention relates to a measuring method for characterizing a semiconductor component and also to a measuring device for a semiconductor component.

For determining physical parameters and, in particular, loss mechanisms in semiconductor components, spatially resolving measuring methods are advantageous, because in this way defined physical parameters or loss mechanisms could be allocated to defined spatial sub-areas of the semiconductor component and thus, for example, spatial inhomogeneities in the production process of the semiconductor component could be detected and analyzed in a simple way.

These methods are used, in particular, for characterizing semiconductor components in the form of semiconductor solar cells or precursors of such solar cells in the development process, i.e., a semiconductor element that has at least one pn junction. Below, the term "solar cell" is used both for designating the completed solar cell and also for its precursors in the fabrication process, as long as this precursor already has a pn junction.

For the spatially resolved measurement of a solar cell, measuring devices are known that comprise an illumination device, measurement electronics, and a camera system or some other spatially resolving detection unit. By means of the illumination device, the solar cell is typically illuminated over its entire surface area from the front and/or rear side. The free charge-carrier pairs generated in this way are separated at the pn junction of the solar cell.

The measurement electronics are typically connected to the electrical contacts of the solar cell, so that, by means of the measurement electronics, the working point of the solar cell, i.e., the current or voltage values at the electrical contacts can be specified.

For the quantitative or qualitative analysis, measurements at different working points along the current/voltage characteristic line of the solar cell are performed, in particular, in order to be able to separate different position-dependent parameters of the solar cells from each other.

Typical working points are short-circuit conditions (no voltage drop between the electrical contacts of the solar cell), open-circuit voltage (no current flow between the electrical contacts of the solar cell), and the optimal working point at which the output from the drawn current and the applied voltage is at a maximum.

The operating point selected for a measurement on the current/voltage characteristic curve of the solar cell decisively determines that local properties can be measured. Thus, for example, at the optimal operating point, the current flow from the solar cell is dependent on the local series-resistance network. In contrast, in the case of open-circuit voltages, no external currents are flowing, but equalization currents flow in any case internally in the solar cell, especially for spatially inhomogeneous loss mechanisms. These internal, lateral currents are typically rather small compared with currents at the optimal operating point of the solar cell, so that, in the case of the open-circuit voltage, the influence on the spatially resolved measurement due to current, for example, of the series resistance network of the solar cell, is negligibly small. Therefore, with typical measuring methods, no conclusions on the series resistance network of the solar cell are possible through measurements of the open-circuit voltage of the solar cell.

SUMMARY

The invention is therefore based on the objective of creating a measuring method and a measuring device for characterizing a semiconductor component, wherein this method and device make a technically less complicated, quicker, and easy-to-manage characterization of the semiconductor component, possible, in particular with respect to the series resistance network, compared with known measuring methods. In particular, a measurement should also be possible without forming electrical contacts with the semiconductor component, wherein, during this measurement, the semiconductor component has, at least in sub-areas, a state that corresponds to the state of an electrically contacted semiconductor component for the feeding or discharge of charge carriers by means of the electrical contacting, in particular, the state that corresponds to or is at least similar to the state at the optimal operating point of the semiconductor component.

This objective is met by providing a measuring method for characterizing a semiconductor component with at least one pn junction. In accordance with another embodiment, the present invention is a measuring device for a semiconductor component with a modification unit, which influences a radiation source in specified sub-areas with respect to intensity or spectral composition. Various other embodiments of the present invention are also described.

The measuring method according to the invention is used for the characterization of a semiconductor component with a measurement area that is the front and/or rear side of the semiconductor component and with at least one pn junction. It comprises the following steps:

In one Step A, electromagnetic excitation radiation is applied to the measurement area of the semiconductor component over a surface. Typically, for the measuring method according to the invention, the excitation radiation is applied to a front side of the semiconductor component constructed for light coupling, i.e., advantageously the measurement area is the front side of the semiconductor component, because typically in the case of solar cells, the front side is constructed for light coupling. However, it also likewise lies in the scope of the invention to apply excitation radiation to the rear side of the semiconductor component or both to the front and also the rear side, especially for semiconductor components constructed for two-sided light coupling.

Through the use of the electromagnetic excitation radiation that is coupled into the semiconductor component, charge-carrier pairs are generated that are separated at the pn junction of the semiconductor component.

In one Step B, electromagnetic radiation emerging from the semiconductor component is measured in a spatially resolved way by at least one detection unit.

A spatially resolved measurement here means that for several sub-areas and/or spatial points on the solar cell, advantageously on the measurement side, a measurement of the electromagnetic radiation emerging from the semiconductor component is performed separately.

It is essential that, in one Step A, excitation radiation is applied to the measurement area, advantageously with homogeneous intensity, over a surface, but not over the entire surface. This means that at least one specified excitation sub-area of the measurement area receives an intensity of the excitation radiation specified for this excitation sub-area and at least one other sink sub-area of the measurement area receives an intensity of the excitation radiation that is lower relative to the excitation sub-area. Advantageously, the sink sub-area is shaded over a surface relative to the excitation radiation illuminating the excitation sub-area.

With the measuring method according to the invention, it is thus possible to design the extent of separation of charge-carrier pairs in the semiconductor component selectively for each of the specified sub-areas. In this way, current-flow patterns can be specified in the semiconductor component, because compensation currents, typically lateral currents, i.e., parallel to the front or rear side of the semiconductor component, typically flow between a sub-area receiving excitation radiation (an excitation sub-area) of the semiconductor component and a sub-area receiving none or only minimal excitation radiation (a sink sub-area) of the semiconductor component. In the case of the measuring method according to the invention, currents are thus induced that flow from the excitation sub-areas into the sink sub-areas. The current-flow pattern is generated by the arrangement of the excitation and sink sub-areas, so that no electrical contacting of the semiconductor component is required for generating the current flow pattern.

With the measuring method according to the invention, current-flow patterns are generated in the semiconductor component selectively through the specification of the excitation and sink sub-areas and associated intensities of the excitation radiation.

The electrical contacting of the completed semiconductor component is realized by one or more contact structures deposited on the front and/or rear side of the semiconductor component. The contacting structures represent current-discharge areas or current-feed areas that can be connected in an electrically conductive way to external contacts for the feeding or discharge of charge carriers. Typically, the contacting structures are realized by metallization structures or highly doped areas and therefore have low impedance, especially relative to the emitter of the semiconductor component, and thus feature higher conductivity than this.

An area of the surface of the semiconductor component covered by a contacting structure is designated as a contacting area in the scope of this application. Furthermore, in the case of not yet completed semiconductor components in which contacting structures have not yet been deposited, those areas that are provided for the deposition of a contacting structure, i.e., such that the contacting areas are covered in a later fabrication step with a contacting structure, are designated as contacting areas.

In the case of solar cells, typically the contacting is performed by one or more metallization structures deposited on the front and/or rear side of the semiconductor component. Advantageously, the metallization areas, i.e., those areas of the measurement area that are covered by metallization or are provided for coverage with metallization are the contacting areas.

In the case of the method according to the invention, in at least one Step A, at least one pair of excitation and sink sub-area is arranged on opposite sides of a specified contacting sub-area such that they at least border or overlap completely or partially the contacting sub-area. The contacting sub-area here comprises the entire contacting area of the contacting structure or a specified sub-area of this structure.

This has the consequence that a current flow is performed starting from the excitation sub-area in the direction of the sink sub-area also from the excitation sub-area in the direction of the contacting sub-area. This current flow therefore corresponds to a current flow in which charge carriers are pulled from the contacting sub-area and thus flow from the excitation sub-area into the contacting sub-area. In this way, a current flow pattern is generated that corresponds to or at least approximates that of the electrically contacted semiconductor component at least for the specified excitation sub-area.

Typical contacting structures are constructed such that the front and/or rear side of the semiconductor component is divided into segments by the contacting structures. For example, lattice-like or comb-like metallization structures are typical for electrical contacting in the case of solar cells.

Advantageously, in Step A, at least one segment defined by the contacting structure forms the excitation sub-area, wherein all of the adjacent sub-areas of the semiconductor, i.e., those opposite the contacting lines bordering the segment are to be provided as sink areas. In at least one Step A, an excitation sub-area thus covers at least one segment or multiple adjacent segments and the segments adjacent to this excitation sub-area are thus covered by sink sub-areas. For the simple definition of the current-flow pattern and simpler evaluation, advantageously the excitation sub-area covers exactly one segment.

In this way, a current-flow pattern is generated in which a current flow is realized into the adjacent segments from one or more adjacent segments and thus in the direction of the contacting sub-areas bordering the segments. The resulting current-flow pattern thus corresponds for the excitation sub-area, i.e., for one or more segments, to the state for the electrical contacting of the semiconductor component.

Additionally or alternatively it is advantageous to define the segments as follows: advantageously, in at least one Step A, at least one excitation sub-area, advantageously in all Steps A, all excitation sub-areas are bordered by the edge of the contacting sub-area, as well as furthermore by additional contacting sub-areas and/or furthermore by one or more edges of the semiconductor component. In this way it is guaranteed that the excitation sub-area comprises a total surface area starting from which charge carriers flow in the direction of the contacting sub-areas in the case of a contacted semiconductor component. In contrast, if the excitation sub-area were to comprise only a part of this surface, then a sink would exist between the excitation sub-area and a contacting sub-area. Such a current-flow pattern with a sink between an excitation sub-area and a contacting sub-area, however, typically does not occur for the electrically contacted semiconductor components and thus does not represent a realistic state of an electrically contacted semiconductor component.

Therefore, in Step A, advantageously at least one excitation sub-area has and advantageously all of the excitation sub-areas in all of the Steps A have a common border with a specified contacting sub-area, so that, on this common border, there is, in particular, no sink between the excitation sub-area and the contacting sub-area. Advantageously, the excitation sub-area extends along one side of the contacting sub-area. Especially in the case of elongated or linear contacting sub-areas, it is advantageous when the excitation sub-area extends along a longitudinal side of the contacting sub-area, advantageously along the entire longitudinal side.

Furthermore, in Step A it is advantageous that at least one excitation sub-area and advantageously all of the excitation sub-areas in all of the Steps A have the maximum extent that is possible for bordering by one or more specified contacting sub-areas and optionally one or more edges of the semiconductor component. In particular, it is advantageous that the excitation sub-area has the maximum extent that is possible for bordering by one or more specified contacting sub-areas within the contacting sub-areas adjacent to the excitation sub-area and optional edges of the semiconductor component. For simplifying the evaluation of the measurements it is advantageous when, in addition to the previously named border, the excitation sub-area is convex.

Typically, a contacting structure and accordingly the associated contacting sub-area do not reach directly up to the edge of the semiconductor component, but instead have a slight distance 13 to this edge. With respect to the maximum extent, this slight distance advantageously remains out of consideration: the border by the contacting sub-areas is expanded in the slight distance between by an imaginary extension of the contacting sub-areas up to the closest edge and advantageously perpendicular to this edge. Additionally or alternatively it is advantageous to select each excitation sub-area to be convex, in order to close any border gaps.

Furthermore it is additionally or alternatively advantageous to specify simple geometric shapes for the excitation and/or sink sub-areas, in particular, a rectangular shape. In this way, a low equipment expense is produced for generating the relevant pattern and also simplifies the evaluation for the combination of the individual measurements into one overall image. In the case of this advantageous embodiment, in at least one Step A, at least excitation sub-area and advantageously all of the excitation sub-areas in all of the Steps A are selected such that they have, in the case of the rectangular shape, the maximum area within the border by one or more specified contacting sub-areas and optionally the edges of the semiconductor component.

A contacting structure of a semiconductor component typically consists of different elements. In particular, in the case of solar cells it is known that a contacting structure comprises at least one so-called busbar and also several contacting fingers connected in an electrically conductive way to the busbar. Busbars and contacting fingers are typically constructed as metallic contacting structures.

The busbar has a higher electrical conductivity relative to the contacting fingers. This is typically guaranteed in that the busbar has a larger cross-sectional area relative to the contacting fingers and thus a lower electrical resistance perpendicular to the cross-sectional area. For the measuring method according to the invention, it is sufficient in most cases that the current-flow patterns of a contact semiconductor component are generated only with respect to the busbar, but not necessarily also with respect to the contacting fingers. Advantageously, a contacting sub-area is therefore defined such that it comprises only the contacting area covered by a busbar. Accordingly, the previously described segmentation is realized exclusively by the busbar. Typically, the busbars have a linear construction, so that the contacting sub-areas are also defined advantageously with a linear construction corresponding to the areas covered by the busbars.

For generating a current-flow pattern with sufficiently strong currents for generating easily measurable measurement signals, it is advantageous that in each Step A, at least 0.5 cm$^2$, advantageously at least 1 cm$^2$ is covered overall by the excitation sub-area or sub-areas. Likewise it is advantageous that in each Step A, a sixth, advantageously a fourth of the area of the measurement area, in particular, for example, half the area of the measurement area is covered by the excitation sub-area or sub-areas. This leads to easily measurable measurement signals especially in the case of typical solar cells with 2 to 3 busbars.

If the semiconductor component has several busbars or contacting sub-areas provided for coverage with busbars, then it is advantageous that for a number b of busbars in each Step A at least one part of $1/(2b)$, advantageously at least one part of $1/b$ of the area of the measurement area is covered overall by the excitation sub-area or sub-areas, for generating sufficiently high currents and corresponding sufficiently high measurement signals.

Advantageously, Step A is executed at least twice, wherein each measurement is performed according to Step B and the Steps A have different excitation sub-areas. Thus, in the case of two different Steps A, there is excitation in different excitation sub-areas of the measurement area.

The combination of spatially resolved measurements performed in the at least two Steps B allows the creation of an overall measurement image such that a measurement image of the electrically contacted component equals or approximates at least in the excitation sub-areas.

Advantageously, the excitation sub-areas are selected such that all of the excitation sub-areas of all Steps A taken together cover at least the measurement area in the areas that are not covered with a contacting structure or that are not provided for coverage with a contacting structure.

After execution of all Steps A, excitation radiation of the intensity specified for the excitation sub-areas is applied at least once to at least all of the areas of the measurement area that are not covered with a contacting structure or that are not provided for coverage with a contacting structure. In this way it is possible to obtain, by combining all of the measurements, an overall measurement image in which excitation radiation of the intensity specified for the excitation sub-areas has been applied to the entire measurement area (optionally with the mentioned limitations with respect to the contacting areas) and simultaneously a current-flow pattern forms the basis of the overall measurement image, wherein this pattern was selected by the combination of excitation sub-areas and sink sub-areas specified in the appropriate Steps A. This allows, in particular, the non-contact characterization of the semiconductor component while generating current-flow patterns that correspond to those of an electronically contacted component. Advantageously, the method according to the invention is therefore performed without electrical contacting of the semiconductor component for accelerating and simplifying the measuring method.

Therefore, the method according to the invention is suitable, in particular, for the characterization of semiconductor solar cells or precursors of these solar cells in the fabrication process, if the precursor already has at least one pn junction. Likewise, however, the method is also suitable for the characterization of other semiconductor components, especially for those semiconductor components that have at least one surface-area pn junction that runs at least partially approximately parallel to the front or rear side.

The Steps A and B are typically performed simultaneously, i.e., when excitation radiation is being applied to the semiconductor component, the spatially resolved measurement is performed simultaneously. However, it also lies in the scope of the invention to perform the Steps A and B one after the other. It likewise lies in the scope of the invention to apply pulsed excitation radiation to the semiconductor element (Step A) according to a specified pulsed application frequency during a continuous measurement (Step B), in order to perform a measurement in the known lock-in method in which such measurement signals that have a frequency deviating from the pulsed application frequency are filtered out.

The spatially resolved measurement is performed in Step B advantageously at least in the excitation sub-areas of the associated Step A; advantageously in Step B a spatially resolved measurement of the entire measurement area or the entire front and/or rear side of the semiconductor component is performed. Likewise it lies in the scope of the invention to measure only the sink sub-areas of the associated Step A in a spatially resolved way in Step B. This is especially advantageous when the method according to the invention is used for diodes that emit over a large surface area, because for such semiconductor components, the characterization of sink sub-areas is typically essential.

Advantageously, the semiconductor component is illuminated in all Steps A in all of the excitation sub-areas with excitation radiation of an identical spectrum and between the excitation and sink sub-areas, only the intensity varies, because, in particular, a change in intensity of the excitation radiation can be performed in a simple and economical way by optical filters or apertures.

For generating uniform measurement conditions, it is advantageous for all of the Steps A for all of the excitation sub-areas to specify an identical intensity of the excitation radiation and/or to specify an identical intensity of the excitation radiation for all Steps A for all sink sub-areas.

For generating sufficiently high compensation currents between the excitation and sink sub-areas, it is advantageous when the intensity of the excitation radiation in the sink sub-areas is less at least by a factor of 10, advantageously by a factor of 100, more advantageously by a factor of 1000 than in the excitation sub-areas.

For generating maximum compensation currents, advantageously in at least one specified sink sub-areas the intensity 0 is specified, i.e., excitation radiation is not applied to these sub-areas in Step A, so that no charge-carrier pairs are generated in this sub-area. In particular, it is advantageous that the intensity 0 is specified for all of the sink sub-areas of all Steps A.

Furthermore, the excitation and sink sub-areas are advantageously selected such that the resulting current-flow pattern in the excitation sub-areas correspond approximately to the current-flow patterns in the case of current draw or current injection via electrical contacting, advantageously to the state of the semiconductor component at the optimal operating point.

In Step A, in order to produce a clearly defined state of the semiconductor component, it is advantageous that in each Step A, excitation sub-areas and sink sub-areas taken together cover at least the measurement area in the areas that are not covered with a contacting structure or that are not provided for coverage with a contacting structure.

As described above, the method according to the invention has the advantage that by combining all of the measurements, an image is generated in which excitation radiation according to the intensity specified for the excitation sub-areas has been applied at least once to all of the areas of the measurement area (optionally under exclusion of the contacting areas). For preventing multiple measurement signals from identical areas, it is advantageous that the excitation sub-areas of all Steps A are disjoint, in particular, disjoint in pairs. This means that all excitation sub-areas taken together have no overlap and thus excitation radiation of the intensity specified for the excitation sub-areas is not applied multiple times to one area of the measurement area.

As described above, in the case of the method according to the invention, a specified current-flow pattern is generated by the specified arrangement of the excitation and sink sub-areas. For generating easily understandable current-flow patterns and for the simple combination of an overall image from the individual measurements, it is advantageous that each excitation sub-area is convex in at least one Step A, advantageously in all Steps A.

In one advantageous construction of the measuring method according to the invention, the Steps A and B are executed at least twice, so that a first and at least second spatially resolved measurement of the electromagnetic radiation emerging from the semiconductor component is realized. Here, in the case of the first measurement, different excitation sub-areas and/or different intensities of the excitation radiation are specified relative to the second measurement. Furthermore, it is advantageous that in the case of at least one measurement in a Step A', excitation radiation is applied to the measurement area of the semiconductor component over a large surface and homogeneously with respect to the radiation intensity.

Thus, in this advantageous construction, several spatially resolved measurement images of the electromagnetic radiation emerging from the semiconductor component are available in which different sub-areas have received excitation radiation or the entire measurement area of the semiconductor component has received excitation radiation homogeneously. A combination of this measurement data allows the quantitative conclusion on physical parameters of the semiconductor component, in particular, on series resistance distributed spatially inhomogeneously. The measurement with large-surface illumination of the measurement area is here used as a reference, wherein an overall measurement image assembled from the measurements when excitation radiation is being applied to the excitation sub-areas is set in relation to the reference. This is performed, for example, by measuring the luminescence radiation advantageously by the division of the measurement values of the overall measurement image and reference (respectively for each position point of the measurement) and by measuring the heat radiation by means of thermography advantageously by the subtraction of the measurement values of the overall measurement image and reference (respectively for each position point of the measurement).

Advantageously, excitation radiation is applied to different sub-areas in two measurements and, in a third measurement, excitation radiation is applied to the measurement area as described over a large surface and homogeneously. In a subsequent evaluation step, the spatially resolved measurements are calculated from the three measurements for each position point by specified calculation methods, so that for each position point, an evaluated measurement result is produced.

Studies of the applicant have produced that, for the measurement of luminescence radiation, advantageously the calculation method is specified according to Formula 1:

$$ME_i = \ln(M1_i + M2_i) - \ln(M3_i); \forall i(1, \ldots, n) \qquad \text{(Formula 1)}$$

i.e., in the case of overall n measurement points, the measurement result $ME_i$ for each position point i according to Formula 1 is defined as a function of the measurement values for the position point i from the first measurement $M1_i$, from the second measurement $M2_i$ and from the third measurement $M3_i$.

Thus, for each measurement point, the difference with respect to the intensity is formed from the first two measurements, wherein the base level of the electromagnetic radiation that emerges from the semiconductor component and is present in the case of homogeneous, full-surface-area illumination is eliminated by subtraction of the third measurement. Thus, as a result, spatially resolved data of the lateral signal distribution caused by the current flow pattern is provided, so that, in particular, conclusions with respect to the series resistance distribution in the semiconductor component are possible.

Advantageously, the sub-areas in the first two measurements are specified such that the current-flow pattern on the illuminated part is similar to the current-flow pattern during current draw at the electrical contacts of the solar cell. Advantageously, here a current-flow pattern is generated that is similar to the normal operation at the optimal operating point, in particular, such that the current flows in the semiconductor component flow in the direction of the electrical contactings, advantageously the busbars, of the semiconductor component.

Typical solar cells have a lattice-like metal structure on the front side constructed for the light coupling, wherein metallization lines run approximately parallel across the front side of the solar cell (the already described busbars) starting opposite from which thinner metallization fingers usually run perpendicular to the busbars.

Advantageously, the sink sub-areas are selected such that the limits of the sink sub-areas correspond approximately to the busbars or to the edges of the semiconductor component.

In one preferred embodiment of the method according to the invention, for characterizing such a solar cell with, for example, two busbars in the case of the spatially resolved measurement, excitation radiation is applied to the solar cell in a first excitation sub-area that lies between two adjacent busbars and is bordered by these busbars and also the edge of the solar cell and the other sub-areas, as sink sub-areas, receive no radiation or only the relatively lower intensity of the excitation radiation.

In the case of the second spatially resolved measurement, conversely, excitation radiation is applied to the remaining sub-areas, as excitation sub-areas, and the first sub-area, as a sink sub-area, receives no radiation or only excitation radiation with low intensity compared with the other sub-areas.

Thus, in the case of the first spatially resolved measurement, charge carriers are generated essentially in the sub-area between the busbars. This leads to a current flow to the non-illuminated sub-area, because the significant portion of the recombination of the generated charge carriers takes place there. Through this arrangement, in the case of the first measurement, a current-flow pattern is generated in the sub-area between the busbars toward the busbars, because seen outward from the first sub-area, the sub-areas illuminated not at all or only slightly lie behind the busbars.

This means that there is a similar current-flow pattern than if contacting at the solar cell would take place at the busbars and charge carriers are tapped from the busbars.

The decisive advantage is thus that a current-flow pattern comparable with that of a contacted solar cell is generated, without the solar cell having to be contacted. This allows a non-contact measurement of a solar cell, so that considerably shorter measurement times and considerably lower technical complexity is required for measuring the solar cell and also, in the case of the measurement, no mechanical loading of the solar cell is realized by electrical contacting.

A corresponding situation also applies for the second, spatially resolved measurement: here the area between the busbars represents the sub-area that is illuminated not at all or only slightly, so that the charge-carrier pairs separated in the other sub-areas of the solar cell by means of the excitation radiation flow toward the first sub-area, i.e., in particular, toward the busbars, but this time outward from the other side, compared with the first spatially resolved measurement.

Thus, in the second, spatially resolved measurement, a current-flow pattern is generated in the other sub-areas as if the solar cell were contacted to the busbars and charge carriers were tapped from these busbars.

The combination of the spatially resolved first and second measurement thus produces a current-flow image of the entire solar cell as if these were contacted at the busbars.

The consideration of the third spatially resolved measurement in the case of excitation radiation applied in a full-surface-area, homogeneous way to the solar cell is used only in that the basic electromagnetic radiation that emerges from the solar cell when radiation is applied to the solar cell and is generated not by the currents leading to the metallization lines is to be considered as a reference point, so that a simpler and more exact evaluation is possible.

In one advantageous construction of the measuring method according to the invention, in the specified sub-areas the semiconductor component receives excitation radiation with specified intensity and/or specified spectrum such that optical filters are arranged between the semiconductor components and radiation source in the beam inlet of a radiation source generating the excitation radiation.

Advantageously, the radiation source is constructed such that excitation radiation is applied to the semiconductor component over the full surface homogeneously without sandwiching optical filters. Through selected arrangement and selected construction of the optical filters, the specified radiation is applied to the semiconductor component in the specified sub-areas.

In particular, it is advantageous to construct the optical filters as shadow masks that have a specified absorption degree with respect to the excitation radiation.

Advantageously, in Step B the measurement of electromagnetic radiation (back radiation) emerging from the semiconductor component is performed in a non-contact way. In particular, it is advantageous in the case of the semiconductor components with electrical contacts that, as described above, the electrical contacts of the semiconductor component are not contacted.

A non-contact measurement of electromagnetic radiation emerging from the semiconductor component is especially advantageously with a photoluminescence measuring method. This photoluminescence measuring method is known for characterizing solar cells and is described, for example, in T. Trupke, E. Pink, R. A. Bardos, and M. D Abbot, "Spatially resolved series resistance of silicon solar cells obtained from luminescence imaging," Applied Physics Letters 90, 093506 (2007). The contents of this publication are incorporated herein in their full extent by reference as if fully set forth.

It is likewise advantageous to measure the thermal radiation of the semiconductor component in a spatially resolved way instead of the photoluminescence radiation transmitted during the recombination processes. In another advantageous construction, the spatially resolved measurement in Step B is therefore performed by the ILIT method ("Illuminated Lock-In Thermography"). This ILIT method is known for characterizing solar cells and is described, among other things, in J. Isenberg, W. Warta, J. Apply. Phys. 95(9) 5200 (2004). The contents of this publication are incorporated herein in their full extent by reference as if fully set forth.

The invention further relates to a measuring device for a semiconductor component with a front and rear side. The measuring device comprises a radiation source for applying excitation radiation over a surface area of the front and/or rear side of the semiconductor component, as well as at least one detection unit, for the spatially resolved measurement of electromagnetic radiation emerging from the semiconductor component.

It is essential that the measuring device further comprises a modification unit that is arranged in the beam path of the radiation source between the semiconductor component and radiation source. The modification unit comprises at least one optical filter that can be arranged selectively in the beam path between the radiation source and the semiconductor component. Through the use of the optical filter, the beam of the radiation source can be influenced in specified sub-areas with respect to intensity and/or the spectral composition.

Through the selective arrangement of the optical filter in the beam path between the radiation source and solar cell, it is thus possible to influence, in the specified sub-areas, the beam of the semiconductor component with respect to intensity and/or the spectral composition, so that the beam of the radiation source can be influenced such that a measuring method can be performed so that the semiconductor component does not receive the excitation radiation generated by the semiconductor component over the full surface homogeneously, but instead, through the use of the optical filters that can be arranged selectively, different specified sub-areas of the semiconductor component receive excitation radiation with an intensity specified for each sub-area and/or spectral composition.

Advantageously, the optical filter is constructed as a shadow mask that reduces the beam of the radiation source in at least one specified sub-area with respect to intensity by a specified factor, advantageously by a factor of 10, in particular, a factor of 100. In particular, it is advantageous to construct the optical filter as an aperture, i.e., the optical filter completely absorbs and/or reflects the excitation radiation.

In one advantageous construction of the measuring device according to the invention, the modification unit comprises a displacement device by which the optical filter can be displaced perpendicular to the main axis of the beam of the radiation source, so that it selectively shades a specified sub-area of the semiconductor component from the radiation source.

In another advantageous construction of the measuring device according to the invention, the modification unit comprises a holder on which at least one optical filter is arranged so that it can pivot. The filter is here arranged such that it can be pivoted into a position parallel or a position perpendicular to the main axis of the beam of the radiation source.

In the position parallel to the main axis of the beam of the radiation source, the beam thus can be influenced only to a negligibly small amount by the optical filter. Advantageously, the optical filter is here constructed over a surface with a small thickness less than 5 mm, in particular, less than 3 mm.

In contrast, if the filter is pivoted into the position perpendicular to the main axis of the beam of the radiation source, then it influences the beam of the radiation source in the specified sub-areas and accordingly, in the position of the filter perpendicular to the main axis of the beam, excitation radiation or excitation radiation at specified intensity and/or spectral composition is applied to the semiconductor component only in the specified sub-areas.

Advantageously, the modification unit comprises a pivoting device that is in active connection with the optical filter such that the optical filter can be pivoted selectively relative to the main axis of the beam of the radiation source by means of the pivoting device. In particular, it is advantageous to construct the pivoting device as an electrical pivoting device that can be controlled by means of electrical control signals, so that the alignment of the optical filter can be specified by electrical control signals.

In another advantageous construction, the measuring device according to the invention comprises at least one second optical filter and one second pivoting device, wherein the optical filters can be pivoted independent of each other by the respectively allocated pivoting device.

In another advantageous construction, the measuring device according to the invention comprises at least one optical filter and one displacement unit interacting with this filter. The displacement unit is constructed such that the optical filter can be displaced essentially perpendicular to the main axis of the beam of the radiation source. Thus, the filter can be pushed by the displacement device through the beam of the radiation source, so that a traveling shadow of the filter is produced on the semiconductor component to be measured and thus the semiconductor component is partially shaded during the displacement of the filter, wherein the shaded areas change with displacement of the filter.

In another advantageous construction, the modification unit and radiation source are integrated in a device, wherein the modification unit is constructed such that, through the use of a computer, the sub-areas of the semiconductor component that receive the excitation radiation of the radiation source can be specified. In particular, it is advantageous to construct the radiation source and the modification unit as a conventional video projector ("beamer").

The measuring device according to the invention and also the measuring method according to the invention are suitable, in particular, for characterizing solar cells or precursors of solar cells in the fabrication process in which at least one metallization line is constructed on the front or rear side. These metallization lines are also called "busbars," as already described above. In the areas in which the surface of the solar cell is covered with the metallization line, direct coupling of electromagnetic radiation into the solar cell is not possible, because the radiation is typically reflected and/or absorbed by the metallization line.

Advantageously, the optical filter is therefore arranged on the modification unit such that, in the case of the alignment of the optical filter parallel to the main axis of the beam of the radiation source, the remaining shading by this filter concerns approximately a sub-area of the beam of the radiation source that is allocated to the linear metallization line.

The optical filter is thus arranged such that, in the case of the parallel position relative to the main axis of the beam of the radiation source, the remaining shadow of the optical filter thus falls approximately on the metallization line, so that excitation radiation is applied to all of the relevant sub-areas of the solar cell in the case of this alignment of the optical filter.

The type of electromagnetic radiation detected in Step B and correspondingly the construction of the detection unit can vary according to the desired measurement principle. For example, it is known that, the band-to-band recombination of charge carriers in the semiconductor component typically takes place with light emission. In a so-called photoluminescence (PL) method, this condition is used for the spatially resolved measurement. Likewise, thermography measuring methods are known that detect the lateral heat distribution in the semiconductor component in a spatially resolved way by means of a thermal camera through spatially resolved measurement of the local heat emission. It likewise lies in the scope of the invention to use other spatially resolved measurements for corresponding emerging electromagnetic radiation in Step B.

BRIEF DESCRIPTION OF THE DRAWINGS

Additional features and advantageous constructions of the method according to the invention are described below with reference to the figure. Shown are.

DETAILED DESCRIPTION OF THE PREFERRED EMBODIMENTS

Figure 1:
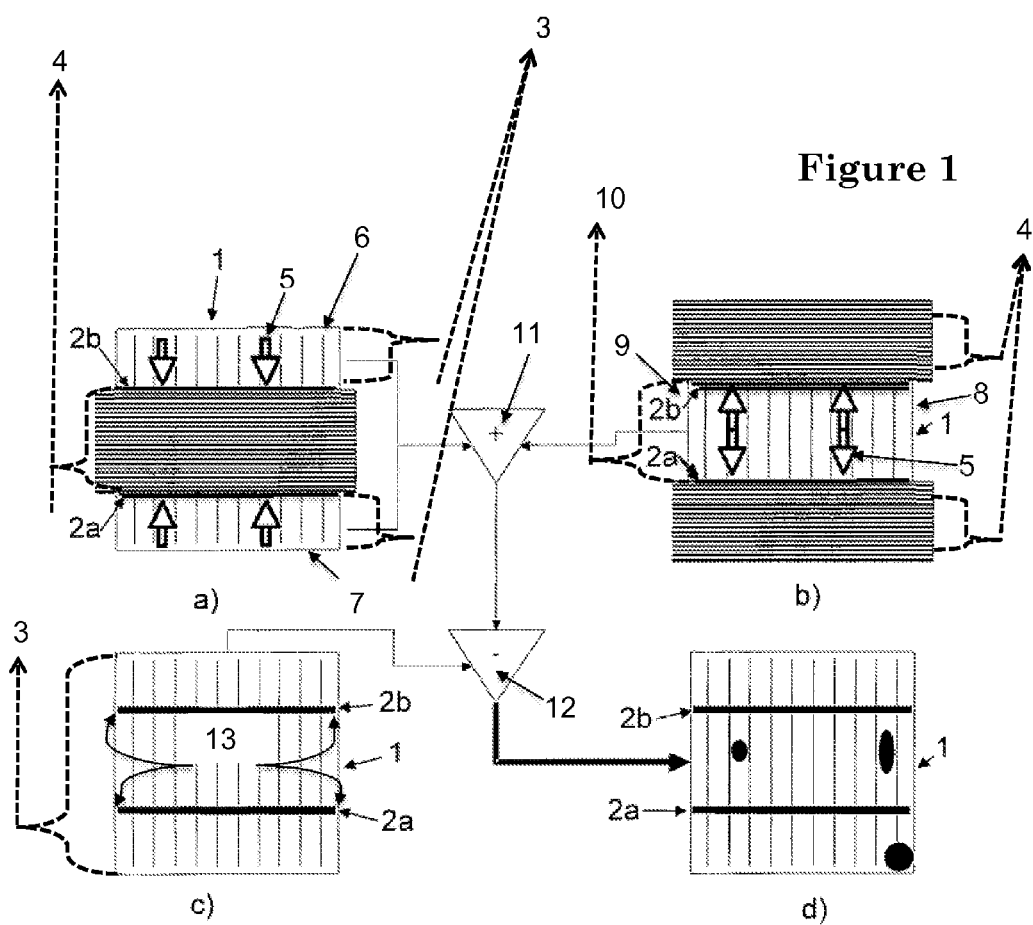
FIG. 1 is a schematic diagram of the development of an embodiment of the measuring method according to the invention.

FIG. 1 shows the application of an embodiment of the measuring method according to the invention for measuring a semiconductor component 1 that is constructed as a solar cell with two metallization lines 2a and 2b that run parallel to each other and that are the busbars of the metallization structure.

For the measurement, a conventional photoluminescence measuring device is used that was expanded by a modification unit with two optical filters.

The cell is not electrically contacted for the measurement. As a whole, three measurements are performed, wherein, for each, an image is made with the camera of the measuring device with a measurement time of one second. The three measurements differ only through different shading conditions with respect to the excitation radiation. The measurement area is here the front side of the solar cell shown in each of FIGS. 1a, b, c, d.

In a first measurement (FIG. 1a), in a first Step A, the sub-area that is defined by the metallization lines 2a and 2b, as well as the edges of the solar cell 6, 7, 8, 9 is shaded, as the sink sub-area 4, by the optical filter (shown by the cross-hatched marking), so that, as excitation sub-areas 3, only a sub-area starting from the metallization line 2b up to the upper edge 6 of the solar cell and a sub-area starting from the metallization line 2a up to the lower edge 7 of the solar cell receive excitation radiation.

Accordingly, only in the two latter sub-areas 3, 4 of the solar cell, a significant separation of charge carriers also appears due to the coupled excitation radiation, so that lateral current flows are produced from these areas in the solar cell in the direction of the metallization lines 2a and 2b that are indicated by the arrows 5 on the solar cell in FIGS. 1a and 1b.

As described above, in this way current-flow patterns are generated that correspond to a contacted solar cell in which, through electrical contacting of the metallization lines 2a and 2b, charge carriers are discharged from these metallization lines 2a, 2b into an external circuit and accordingly, lateral current flows to the metallization lines 2a, 2b are produced in the solar cell.

In a second measurement (FIG. 1b), a measurement image with inverted illumination is recorded, i.e., in a second Step A, the two outer sub-areas are shaded as sink sub-areas 4 (characterized by the crosshatched marking) and, as an excitation sub-area 3, the middle sub-area 10 that is defined by the metallization lines 2a and 2b, as well as the right and the left edges 8 and 9 of the solar cell, receives excitation radiation.

Here, the effect also appears that lateral currents in the direction of the metallization lines 2a and 2b are produced in the solar cell and thus the state of an electrically contacted solar cell is simulated for the middle sub-area 10 of the solar cell.

In the case of this embodiment, the contacting sub-areas 3, 4 are defined, as described above, only as those areas that are covered by the busbars, but not by the metallization fingers. Furthermore, the measurement area is segmented by the contacting sub-areas 3, 4 and in each Step A, each excitation sub-areas 3 covers a segment, wherein the bordering segments are covered by sink sub-areas 4.

Furthermore, in the case of this embodiment, the excitation and sink sub-areas 3, 4 are each bounded by the edges of the solar cell 6, 7, 8, 9 and the contacting sub-areas and each has the maximum extent within these boundaries. With respect to the maximum extent bounded by the edges of the solar cell 6, 7, 8, 9, it is not taken into consideration that the busbars do not reach directly up to the edge 6, 7, 8, 9 of the solar cell, but instead have a slight distance 13 to these edges 6, 7, 8, 9. The bordering by the contacting sub-areas is expanded in the slight distance 13 between the ends of the busbars and the solar cell edges 6, 7, 8, 9 through an imaginary extension of the contacting sub-areas up to the solar cell edges 6, 7, 8, 9.

In the case of the first and second measurement, a spatially resolved image of the photoluminescence radiation is made by means of the camera of the measuring device.

In a third measurement (FIG. 1c), in a Step A', excitation radiation is applied to the entire solar cell, without shading of the excitation radiation taking place.

These three measurement images according to Formula 1 specified above are calculated for each measurement point in an evaluation step: the first two measurement images are added with respect to measurement intensity (by the triangular symbol 11 with "+"), so that a spatially resolved measurement image of the entire solar cell is produced with current-flow patterns each relative to the metallization lines 2a and 2b. The spatially resolved measurement image of the third measurement is subtracted for each position point (triangular symbol 12 with "−"), wherein here, according to Formula 1, the logarithmic measurement values are used.

The series resistance image shown in FIG. 1d) is produced in which possible locally elevated series resistances can be recognized, as shown, for example, schematically in FIG. 1d) by the three ellipses.

Figure 2:
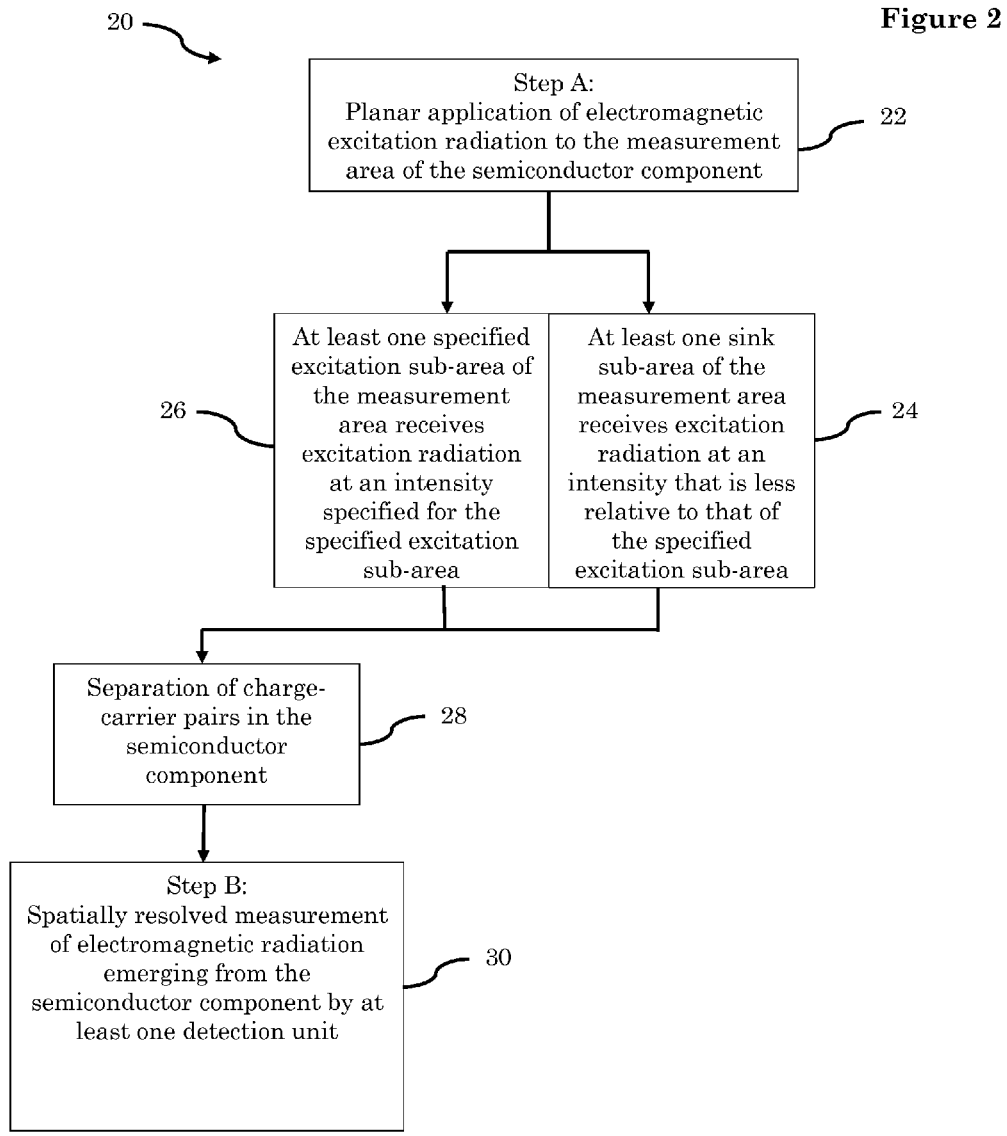
FIG. 2 is a flow chart of an embodiment of the measuring method according to the present invention.

In one Step A, shown in FIG. 2, Box 22, planar electromagnetic excitation radiation is applied to the measurement area, as indicated at Box 24 and 26, of the semiconductor component 1 over a surface. The excitation radiation in Flow Chart 20 is applied to a front side of the semiconductor component 1 or a rear side of the semiconductor component 1 or both to the front and also the rear side, especially for semiconductor components 1 constructed for two-sided light coupling.

It is essential that, in one Step A, excitation radiation is applied to the measurement area, as indicated at Box 24 and 26, advantageously with homogeneous intensity, over a surface, but not over the entire surface. At least one specified excitation sub-area 3 (See FIG. 1) of the measurement area receives an intensity of the excitation radiation specified for this excitation sub-area 3 and at least one other sink sub-area 4 (See FIG. 1) of the measurement area receives an intensity of the excitation radiation that is lower relative to the excitation sub-area 3. The electromagnetic excitation radiation is coupled into the semiconductor component 1, and charge-carrier pairs are generated that are separated, as indicated at Box 28, at the pn junction of the semiconductor component 1.

In one Step B, shown in FIG. 2, Box 30, electromagnetic radiation emerging from the semiconductor component 1 is measured in a spatially resolved way by at least one detection unit.

A spatially resolved measurement here means that for several sub-areas 3, 4 and/or spatial points on the solar cell, advantageously on the measurement side, a measurement of the electromagnetic radiation emerging from the semiconductor component 1 is performed separately.

As described above, a specified current-flow pattern is generated by the specified arrangement of the excitation and sink sub-areas 4.

Figure 3:
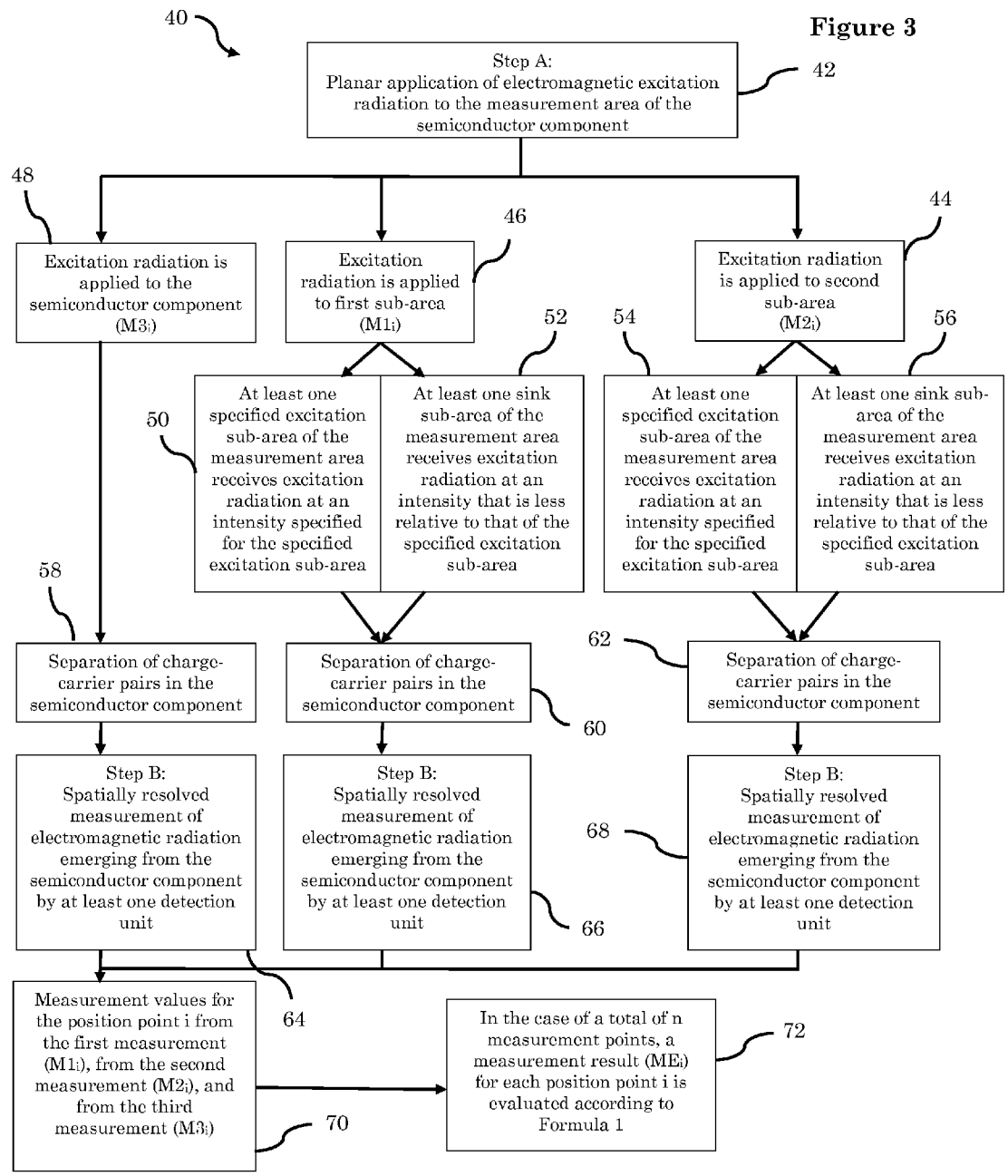
FIG. 3 is a flow chart of an alternative embodiment of the measuring method according to the present invention.

In one advantageous construction of the measuring method according to the invention, shown in FIG. 3, a flow chart 40 shows the Steps A, as indicated at Box 42, and B, as indicated at Boxes 64, 66, 68, are executed at least twice, so that a first and at least second spatially resolved measurement of the electromagnetic radiation emerging from the semiconductor component 1 is realized. Here, in the case of the first measurement, indicated at Boxes 46, 50, 60, 66, different excitation sub-areas and/or different intensities of the excitation radiation are specified relative to the second measurement, indicated at Boxes 44, 56, 62, 68. Furthermore, it is advantageous that in the case of at least one measurement in a Step A', excitation radiation is applied to the measurement area of the semiconductor component 1 over a large surface and homogeneously with respect to the radiation intensity.

Thus, in this advantageous construction, several spatially resolved measurement images of the electromagnetic radiation emerging from the semiconductor component 1 are available in which different sub-areas have received excitation radiation or the entire measurement area of the semiconductor component 1 has received excitation radiation homogeneously. A combination of this measurement data allows the quantitative conclusion on physical parameters of the semiconductor component 1, in particular, on series resistance distributed spatially inhomogeneously. The measurement with large-surface illumination of the measurement area is here used as a reference, wherein an overall measurement image assembled from the measurements when excitation radiation is being applied to the excitation sub-areas 3 is set in relation to the reference. This is performed, for example, by measuring the luminescence radiation advantageously by the division of the measurement values, as indicated at Box 70, of the overall measurement image and reference (respectively for each position point of the measurement) and by measuring the heat radiation by means of thermography advantageously by the subtraction of the measurement values of the overall measurement image and reference (respectively for each position point of the measurement), as shown in FIG. 3.

Excitation radiation is applied to different sub-areas in two measurements, indicated at Boxes 44, 54, 56, 62, 68; 46, 50, 52, 60, 66, and in a third measurement, indicated at Boxes 48, 58, 64, excitation radiation is applied to the measurement area as described over a large surface and homogeneously. In a subsequent evaluation step, indicated at Box 70, the spatially resolved measurements are calculated from the three measurements for each position point by specified calculation methods, so that for each position point, an evaluated measurement result is produced.

Studies of the applicant have produced that, for the measurement of luminescence radiation, advantageously the calculation method is specified according to Formula 1:

$$ME_i = \ln(M1_i + M2_i) - \ln(M3_i); \forall i(1, \ldots, n) \quad \text{(Formula 1)}$$

i.e., in the case of overall n measurement points, the measurement result $ME_i$, indicated at Box 72, for each position point i according to Formula 1 is defined as a function of the measurement values for the position point i from the first measurement $M1_i$ from the second measurement $M2_i$ and from the third measurement $M3_i$.

Thus, for each measurement point the difference with respect to the intensity is formed from the first two measurements, indicated at Box 70, wherein the base level of the electromagnetic radiation that emerges from the semiconductor component 1 and is present in the case of homogeneous, full-surface-area illumination is eliminated by subtraction of the third measurement. Thus, as a result, spatially resolved data of the lateral signal distribution caused by the current flow pattern is provided, so that, in particular, conclusions with respect to the series resistance distribution in the semiconductor component 1 are possible.

The sub-areas in the first two measurements are specified such that the current-flow pattern on the illuminated part is similar to the current-flow pattern during current draw at the electrical contacts of the solar cell. Here a current-flow pattern is generated that is similar to the normal operation at the optimal operating point, in particular, such that the current flows in the semiconductor component 1 flow in the direction of the electrical contactings, advantageously the busbars, of the semiconductor component 1.

In one preferred embodiment of the method according to the invention, for characterizing such a solar cell with, for example, two busbars in the case of the spatially resolved measurement, shown in FIG. 3, Box 66, excitation radiation is applied to the solar cell in a first excitation sub-area that lies between two adjacent busbars and is bordered by these busbars and also the edge of the solar cell and the other sub-areas, as sink sub-areas, receive no radiation or only the relatively lower intensity of the excitation radiation.

In the case of the second spatially resolved measurement, shown in FIG. 3, Box 68, conversely, excitation radiation is applied to the remaining sub-areas, as excitation sub-areas, and the first sub-area, as a sink sub-area, receives no radiation or only excitation radiation with low intensity compared with the other sub-areas.

Thus, in the case of the first spatially resolved measurement, charge carriers are generated essentially in the sub-area between the busbars. This leads to a current flow to the non-illuminated sub-area, because the significant portion of the recombination of the generated charge carriers takes place there. Through this arrangement, in the case of the first measurement, a current-flow pattern is generated in the sub-area between the busbars toward the busbars, because seen outward from the first sub-area, the sub-areas illuminated not at all or only slightly lie behind the busbars.

This means that there is a similar current-flow pattern than if contacting at the solar cell would take place at the busbars and charge carriers are tapped from the busbars.

The decisive advantage is thus that a current-flow pattern comparable with that of a contacted solar cell is generated, without the solar cell having to be contacted. This allows a non-contact measurement of a solar cell, so that considerably shorter measurement times and considerably lower technical complexity is required for measuring the solar cell and also, in the case of the measurement, no mechanical loading of the solar cell is realized by electrical contacting.

A corresponding situation also applies for the second, spatially resolved measurement, shown in FIG. 3, Box 68, here the area between the busbars represents the sub-area that is illuminated not at all or only slightly, so that the charge-carrier pairs separated in the other sub-areas of the solar cell by means of the excitation radiation flow toward the first sub-area, i.e., in particular, toward the busbars, but this time outward from the other side, compared with the first spatially resolved measurement.

Thus, in the second, spatially resolved measurement, a current-flow pattern is generated in the other sub-areas as if the solar cell were contacted to the busbars and charge carriers were tapped from these busbars.

The combination of the spatially resolved first and second measurement thus produces a current-flow image of the entire solar cell as if these were contacted at the busbars.

The consideration of the third spatially resolved measurement, shown in FIG. 3, Box 64, in the case of excitation radiation applied in a full-surface-area, homogeneous way to the solar cell is used only in that the basic electromagnetic radiation that emerges from the solar cell when radiation is applied to the solar cell and is generated not by the currents leading to the metallization lines 2a, 2b is to be considered as a reference point, so that a simpler and more exact evaluation is possible.

In one advantageous construction of the measuring method according to the invention, in the specified sub-areas the semiconductor component 1 receives excitation radiation with specified intensity and/or specified spectrum such that optical filters are arranged between the semiconductor components 1 and radiation source in the beam inlet of a radiation source generating the excitation radiation.

Advantageously, the radiation source is constructed such that excitation radiation is applied to the semiconductor component 1 over the full surface homogeneously without sandwiching optical filters. Through selected arrangement and selected construction of the optical filters, the specified radiation is applied to the semiconductor component 1 in the specified sub-areas.

In particular, it is advantageous to construct the optical filters as shadow masks that have a specified absorption degree with respect to the excitation radiation.

Advantageously, in Step B, as indicated at Boxes 64, 66, 68, the measurement of electromagnetic radiation (back radiation) emerging from the semiconductor component is performed in a non-contact way. In particular, it is advantageous in the case of the semiconductor components 1 with electrical contacts that, as described above, the electrical contacts of the semiconductor component 1 are not contacted.

A non-contact measurement of electromagnetic radiation emerging from the semiconductor component 1 is especially advantageously with a photoluminescence measuring method. This photoluminescence measuring method is known for characterizing solar cells.

It is likewise advantageous to measure the thermal radiation of the semiconductor component 1 in a spatially resolved way instead of the photoluminescence radiation transmitted during the recombination processes. In another advantageous construction, the spatially resolved measurement in Step B is therefore performed by the ILIT method ("Illuminated Lock-In Thermography"). This ILIT method is known for characterizing solar cells.

With the measuring method according to the invention, it is thus possible for the first time to perform measurements in the case of an electrically non-contacted solar cell, under conditions that correspond to a solar cell connected to an external circuit while discharging charge carriers, in particular, from the metallization lines of the solar cell.

In this way, in an economical and quick way, spatially resolved measurements can be performed for characterizing the solar cell. Thus, the measuring method according to the invention and the measuring device according to the invention are suitable, in particular, for inline operation, i.e., for continuous characterizing of the solar cells fabricated in a production line, without the solar cells to be measured having to be removed from the production flow for this measurement. In particular, the complicated electrical contacting of the solar cell, which is associated with high error susceptibility, is eliminated for the measurement.

The invention claimed is:

1. A non-contact measuring method for characterizing a semiconductor component with at least one pn junction and one measurement area that is a front or rear side of the semiconductor component and that has at least one contacting sub-area that is covered with a contacting structure or is provided for coverage with a contacting structure, comprising the following steps:

A) planar application of electromagnetic excitation radiation to the measurement area of the semiconductor component for separation of charge-carrier pairs in the semiconductor component; and, B) spatially resolved measurement of electromagnetic radiation emerging from the semiconductor component by at least one detection unit, wherein in at least one Step A, the measurement area is divided into segments by one or more of the contacting sub-areas and at least one specified excitation sub-area of the measurement area covers at least one segment and receives excitation radiation at an intensity specified for the specified excitation sub-area and at least one sink sub-area of the measurement area receives excitation radiation at an intensity that is less relative to that of the specified excitation sub-area, wherein the excitation sub-area and the sink sub-area are arranged on an opposite side of the at least one contacting sub-area and border the at least one contacting sub-area or completely or partially overlap the at least one contacting sub-area, and in at least one Step A' excitation radiation is applied to the measurement area over a full surface and homogenously with respect to the specified radiation intensity, and a measurement according to Step B is performed at the specified sub-area of the at least one Step A and over the full surface of the at least one Step A'.

2. Method according to claim 1, wherein the measurement area is divided into segments by one or more of the contacting sub-areas, in at least one of the Steps A, at least one of the excitation sub-areas covers at least one segment, and the segments adjacent to the excitation sub-area are covered by the sink sub-areas.

3. Method according to claim 1, wherein in at least one of the Steps A, at least one of the excitation sub-areas or all of the excitation sub-areas have a common border with a respectively specified contacting sub-area.

4. Method according to claim 1, wherein in at least one of the Steps A, at least one of the excitation sub-areas is bordered by an edge of the contacting sub-area, and by either one or more of the contacting sub-areas or by one or more edges of the semiconductor component.

5. Method according to claim 1, wherein the contacting sub-area is a busbar contacting sub-area that is covered by a busbar or is provided for coverage by a busbar.

6. Method according to claim 5, wherein the semiconductor component has a plurality of b busbar contacting sub-areas and in each of the Steps A, at least 1/(2b) of the area of the measurement area is covered by the at least one excitation sub-area.

7. Method according to claim 1, wherein in each of the Steps A, at least ⅙ of the area of the measurement area is covered by the excitation sub-area or sub-areas.

8. Method according to claim 1, wherein Step A is executed at least twice, wherein in each of the at least two Steps A, a measurement according to Step B is performed, and wherein the measurement according to Step B and the execution of the Steps A occur in different excitation sub-areas.

9. Method according to claim 1, wherein all of the excitation sub-areas of all Steps A taken together cover at least the measurement area outside of the contacting areas, or the entire measurement area.

10. Method according to claim 1, wherein for the at least one specified sink sub-area, the intensity 0 is specified for the excitation radiation, so that the at least one sink sub-area in Step A does not receive excitation radiation.

11. Method according to claim 1, wherein in each of the Steps A, the excitation sub-areas and the sink sub-areas taken together cover at least the measurement area outside of the contacting areas or cover the entire measurement area.

12. Method according to claim 1, wherein the excitation sub-areas from one or more measurements of the Steps A are separate such that there is no overlap during a single measurement and no excitation sub-area receives excitation radiation twice.

13. Method according to claim 1, wherein in at least one Step A, all of the excitation sub-areas are convex.

14. Method according to claim 1, wherein three measurements for characterizing the semiconductor component are performed, each of the three measurements comprising at least one Step A and at least one Step B, wherein, in two of the measurements, the excitation radiation is applied to the different sub-areas and, in a third one of the measurements, the excitation radiation is applied to the semiconductor component over the full surface and homogeneously, in particular, in an evaluation step for each position point I, an evaluation is performed according to Formula 1

$$ME_i = \ln(M1_i + M2_i) - \ln(M3_i); \forall i(1, \ldots, n) \quad \text{(Formula 1)}$$

wherein a total of n measurement points, a measurement result $ME_i$ for each position point i according to Formula 1 is dependent on measurement values for the position point i from the first measurement $M1_i$, from the second measurement $M2_i$, and from the third measurement $M3_i$.

15. Method according to claim 1, wherein for measuring a semiconductor component with at least two metallization lines running approximately parallel, in particular, of a solar cell, in a first spatially resolved measurement according to Step B, the excitation radiation is applied to the semiconductor component according to Step A in a first sub-area that lies between the metallization lines and is bordered by these lines, as well as the edge of the semiconductor component and the remaining sub-areas receive no radiation or only radiation at a smaller intensity relative to the starting radiation, and in a second, spatially resolved measurement according to Step B, excitation radiation is applied according to Step A to the remaining sub-areas and the first sub-area receives no excitation radiation or only radiation at an intensity that is lower compared with the remaining sub-areas.

16. Method according to claim 1, wherein optical filters are arranged in the beam path of a radiation source generating the planar application of electromagnetic excitation radiation and in between the semiconductor component and the radiation source, the semiconductor component receives radiation with altered intensity or altered spectrum in a portion of the measurement area, wherein the optical filters are shadow masks that have a specified degree of absorption with respect to the excitation radiation.

17. Method according to claim 1, wherein in Step B, the spatially resolved measurement is performed by a photoluminescence measuring method or an illuminated-lock-in thermography measuring method.

18. Method according to claim 1, wherein the Steps A and B are executed simultaneously.

\* \* \* \* \*